(12) United States Patent
Kawasumi

(10) Patent No.: US 6,687,182 B2
(45) Date of Patent: Feb. 3, 2004

(54) SEMICONDUCTOR MEMORY DEVICE

(75) Inventor: Atsushi Kawasumi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/281,251

(22) Filed: Oct. 28, 2002

(65) Prior Publication Data

US 2003/0128616 A1 Jul. 10, 2003

(30) Foreign Application Priority Data

Oct. 30, 2001 (JP) ........................................ 2001-332232

(51) Int. Cl.$^7$ ................................................. G11C 8/00
(52) U.S. Cl. ............................ 365/230.03; 365/189.08; 365/230.06
(58) Field of Search ....................... 365/230.03, 230.06, 365/189.08, 191, 63

(56) References Cited

U.S. PATENT DOCUMENTS 5,654,931 A * 8/1997 Tamba et al. .......... 365/230.03

FOREIGN PATENT DOCUMENTS

JP          09-139082          5/1997

* cited by examiner

*Primary Examiner*—Michael S. Lebentritt
*Assistant Examiner*—Hien Nguyen
(74) *Attorney, Agent, or Firm*—Oblon, Spivak, McClelland, Maier & Neustadt

(57) ABSTRACT

A semiconductor memory device, comprising: a plurality of blocks arranged in line in a first direction, each block including a plurality of sections each having a cell group obtained by dividing a cell array composed of a plurality of cells and a cell group control circuit which controls read/write for the corresponding cell group and operates independently to each other, the plurality of sections being arranged in line in a second direction; data lines extending in the second direction and commonly connected to the plurality of sections in the same block, the data lines transferring data for the plurality of sections; and signal lines passing through the plurality of blocks and extending in the first direction, the signal lines transferring at least one of a control signal which controls read/write for the sections, an address signal which selects the sections, and the other signal transferred to the sections.

19 Claims, 4 Drawing Sheets

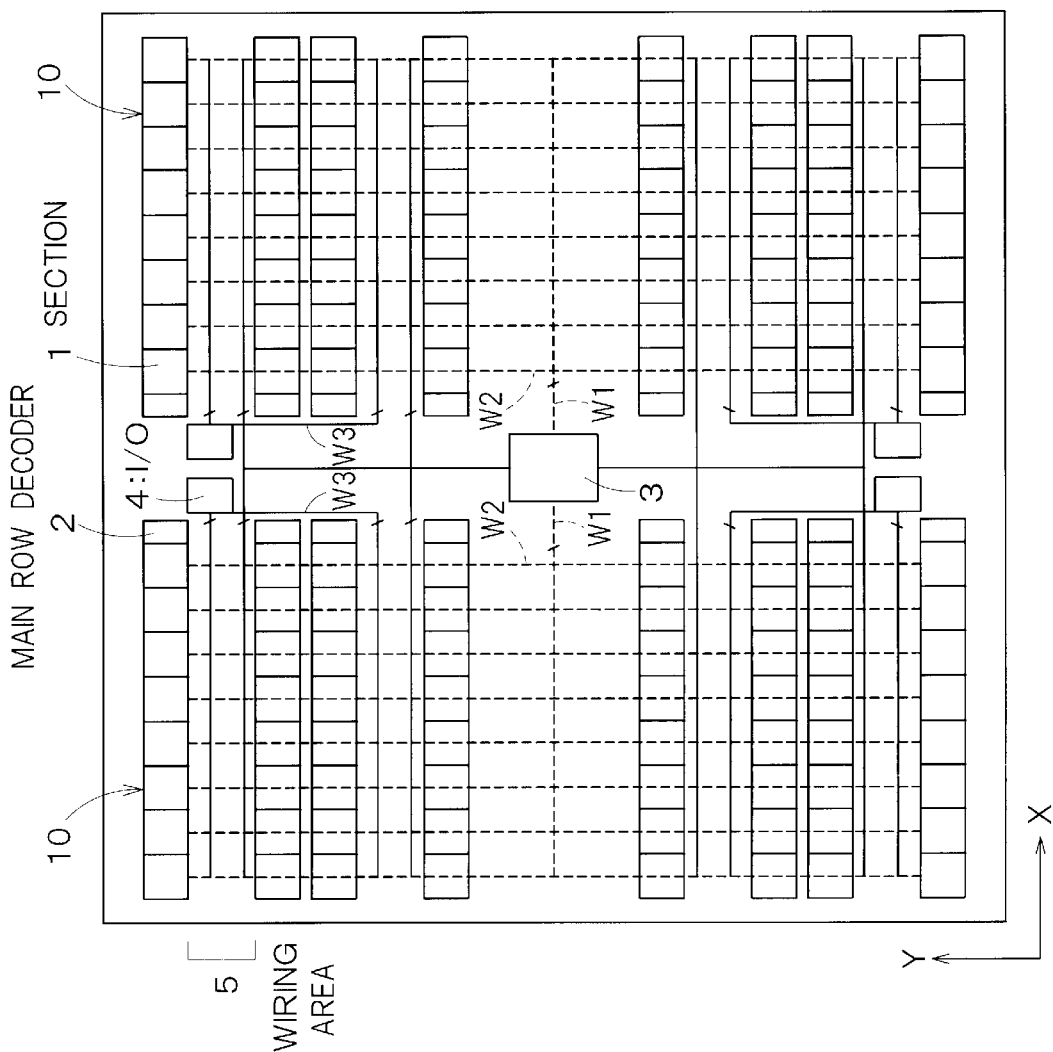
F I G. 1

SEMICONDUCTOR MEMORY DEVICE

CROSS REFERENCE TO RELATED APPLICATIONS

This application is based upon and claims the benefit of priority from the prior Japanese Patent Applications No. 2001-332232, filed on Oct. 30, 2001, the entire contents of which are incorporated herein by reference.

BACKGROUND OF THE INVENTION

1. Field of the Invention

The present invention relates to a semiconductor memory device and arrangement of wirings of the semiconductor memory device.

2. Related Background Art

FIG. 4 is a plane layout view of a conventional semiconductor memory device. The semiconductor memory device of FIG. 4 arranges a plurality of sections obtained by dividing a cell array in order to realize a reduction of power consumption and high speed operation. Wirings of control signals supplied to each section are arranged into a wiring area 5 between the sections arranged in line in Y direction.

Each section is provided with a control circuit for reading and writing cell groups in the section. The control circuit reads and writes the cell groups based on various control signals inputted from outside only when a section selection signal is valid.

As capacity of the memory increases, the number of the sections in a chip is also prone to increase. As the number of the sections increases, the number of the control signals also increases, and the wiring area for the control signals also increases. Accordingly, the ratio that the wiring area of the control signals in the entire area of the chip occupies increases, and fabrication cost rises.

Furthermore, as the number of the divided sections increases, there is a problem in which power consumption increases, because the number of the selected main word lines increases. For example, in FIG. 4, the same row address is inputted to a main row decoder A and a main row decoder B. The main word lines driven by these row addresses are different from a section "a" connected to the main row decoder A and a section "b" connected to the main row decoder B. For example, when the cell in the section "a" is accessed, it is desirable that only the main row decoder A operates. However, because the row addresses inputted to the main row decoders A and B are the same, the main row decoder operates in vain.

Thus, in the conventional semiconductor memory device, there is a problem in which the decoder and so on corresponding to the section which does not perform read/write operates in vain, and as a result, power consumption may increase.

SUMMARY OF THE INVENTION

A semiconductor memory device according one embodiment of the present invention, comprising:

a plurality of blocks arranged in line in a first direction, each block including a plurality of sections each having a cell group obtained by dividing a cell array composed of a plurality of cells and a cell group control circuit which controls read/write for the corresponding cell group and operates independently to each other, said plurality of sections being arranged in line in a second direction;

data lines extending in said second direction and commonly connected to said plurality of sections in the same block, said data lines transferring data for said plurality of sections; and signal lines passing through said plurality of blocks and extending in said first direction, said signal lines transferring at least one of a control signal which controls read/write for said sections, an address signal which selects said sections, and the other signal transferred to said sections.

Furthermore, a semiconductor memory device according one embodiment of the present invention, comprising: a plurality of blocks arranged in line in a first direction, each block including a plurality of sections each having a cell group obtained by dividing a cell array composed of a plurality of cells and a cell group control circuit which controls read/write for the corresponding cell group and operates independently to each other, said plurality of sections being arranged in line in a second direction; data lines extending on said plurality of blocks arranged in line in said first direction, said data lines transferring data to said sections in said plurality of blocks; and signal lines passing through said plurality of blocks and extending in said first direction, said signal lines transferring at least one of a control signal which controls read/write for said sections, an address signal which selects said sections, and the other signal transferred to said sections.

BRIEF DESCRIPTION OF THE DRAWINGS

FIG. 1 is a plane layout view of a semiconductor memory device according to a first embodiment of the present invention.

DESCRIPTION OF THE PREFERRED EMBODIMENTS

Hereinafter, a semiconductor memory device according to an embodiment of the present invention will be more specifically described with reference to drawings.

(First Embodiment)

FIG. 1 is a plane layout view of a semiconductor memory device according to a first embodiment of the present invention. The semiconductor memory device of FIG. 1 has a plurality of blocks each having a cell group operated by the corresponding main row decoder, and being arranged in line in Y (row) direction. Each block has a section arranged in line in X (column) direction, each having the cell group and a cell group control circuit for controlling read/write for the corresponding cell group.

An end portion of each block 10 is provided with the main row decoder. The main row decoder controls whether or not to select a certain block 10.

The vicinity of a central portion of a chip is provided with a decoder control circuit 3 for controlling selection of each section 1. The vicinity of both ends of a central line in X direction of the chip is provided with an I/O circuit 4 for inputting and outputting data for each section 1.

Figure 2:
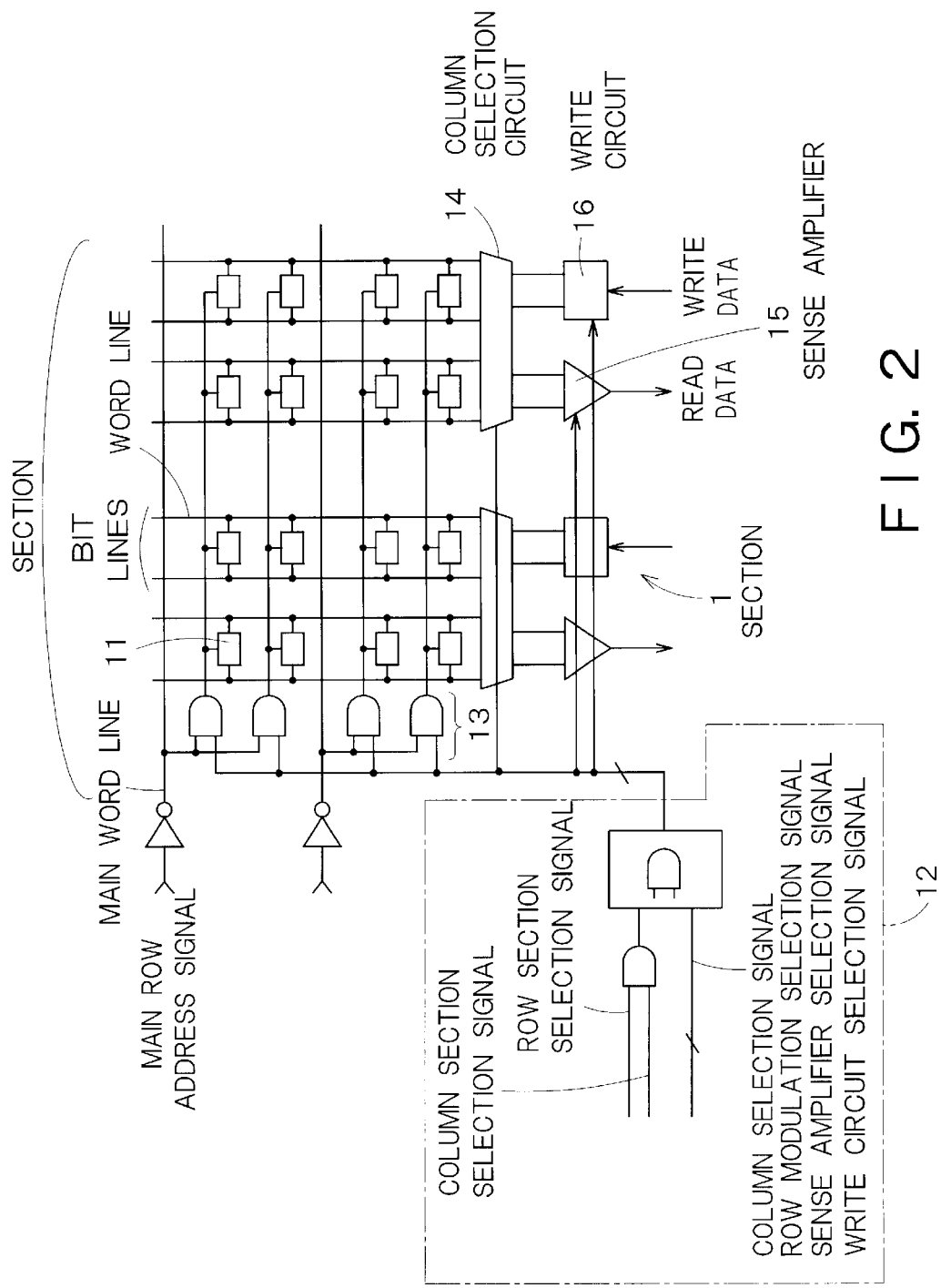
FIG. 2 is a circuit diagram showing internal configuration of each section.

FIG. 2 is a circuit diagram showing internal configuration of each section 1. As shown in FIG. 2, each section 1 has a cell group composed of a plurality of memory cells 11, a section selection circuit 12 for selecting a certain section 1, a word line selection circuit 13 for selecting a word line, a column selection circuit 14, a sense amplifier 15 and a write circuit 16.

A row section selection signal for selecting a certain section 1 among a plurality of sections 1 arranged in the row direction, a column section selection signal for selecting a certain section 1 among a plurality of sections 1 arranged in the column direction, a column selection signal, a row modulation selection signal, a sense amplifier selection signal, and a write circuit selection signal are inputted from outside to the section selection circuit 12.

The section selection circuit 12 selects a certain section 1 based on the row section selection signal and the column section selection signal, and selects a certain column selection circuit 14, a certain sense amplifier 15 and a certain write circuit 16 in the selected section 1 based on the column selection signal, the sense amplifier selection signal and the write circuit selection signal, respectively. The word selection circuit 13 selects one word line based on the row modulation selection signal and the main row address signal.

As shown by a dotted line of FIG. 1, the semiconductor memory device of the present embodiment has wirings W1 extending from the decoder control circuit 3 in X direction and a plurality of wirings W2 extending in Y direction connected to the wiring W1 arranged on the chip. A plurality of wirings W2 extending in Y direction passes through the sections and are connected to the respective sections 1.

The wiring W1 is commonly connected to a plurality of sections 1 in the same block 10, and transfers data for a plurality of sections 1. The wirings W2 passes through a plurality of blocks 10 and extends in Y direction, and transfers at least one of a control signal for controlling read/write for the section, the an address signal for selecting the section, and the other signals transferred to the sections. The above-mentioned row section selection signal and the column section selection signal are also transferred by at least one of the wirings W1 and W2.

In the semiconductor memory device of FIG. 1, the wiring (data line) W3 for connecting the I/O circuit 4 and each section 1 is arranged in the wiring area between the sections 1 of Y direction and extended in X direction, similarly to the conventional semiconductor memory device. The wirings W3 are commonly connected to the sections in the same block 10.

Thus, according to the present embodiment, at least a portion of the signals transferred between the decoder control circuit 3 and each of the sections 1 is transferred to each section 1 by using the wiring W1 extending from the decoder control circuit 3 in X direction and the wiring W2 orthogonal to the wiring W1 and passing through the section. Because of this, it is possible to reduce the number of the wirings arranged between the sections 1 in Y direction. Accordingly, it is possible to closely arrange the neighboring sections 1 in Y direction, thereby reducing chip size.

According to the present embodiment, only one section 1 selected by the section selection circuit 12 set the word line selection circuit 13, the column selection circuit 14, the sense amplifier 15 and the write circuit 16 to enable state. Because of this, each circuit in the unselected section 1 does not operate in vain, thereby reducing power consumption, compared with the conventional semiconductor memory device.

(Second Embodiment)

Figure 3:
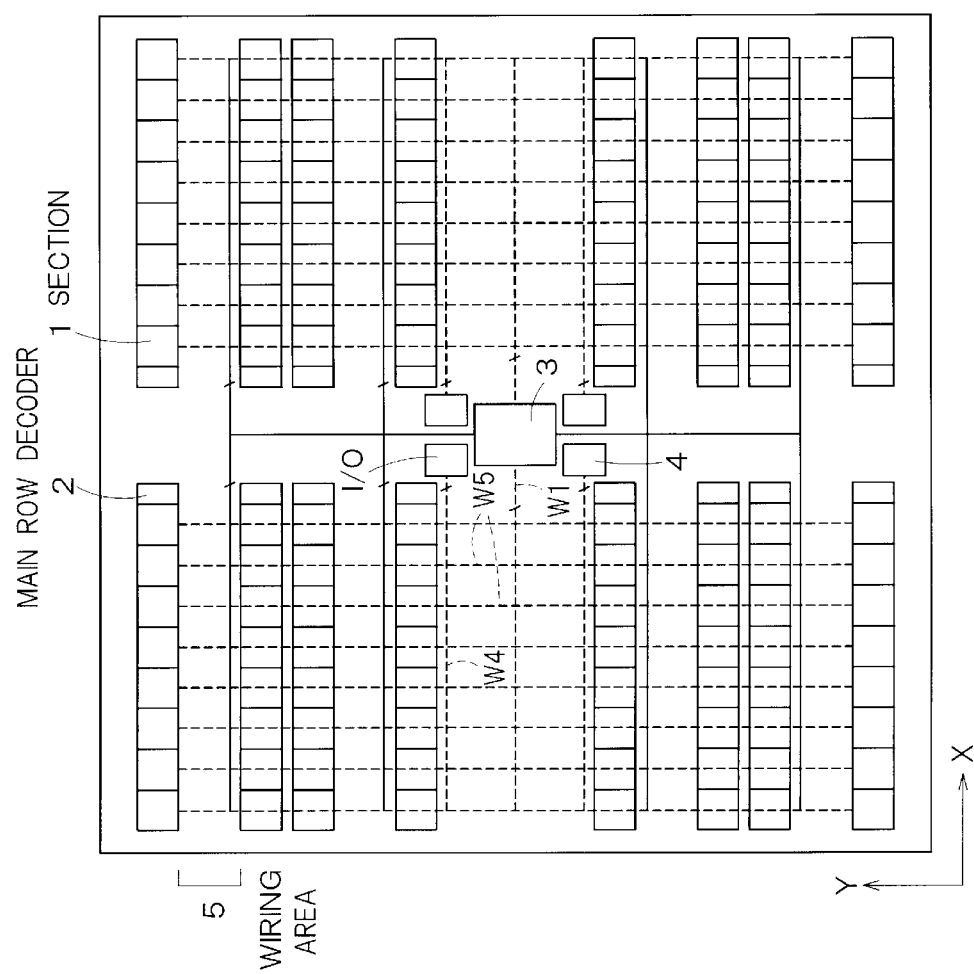
FIG. 3 is a plane layout view of a semiconductor memory device according to a second embodiment of the present invention.
Figure 4:
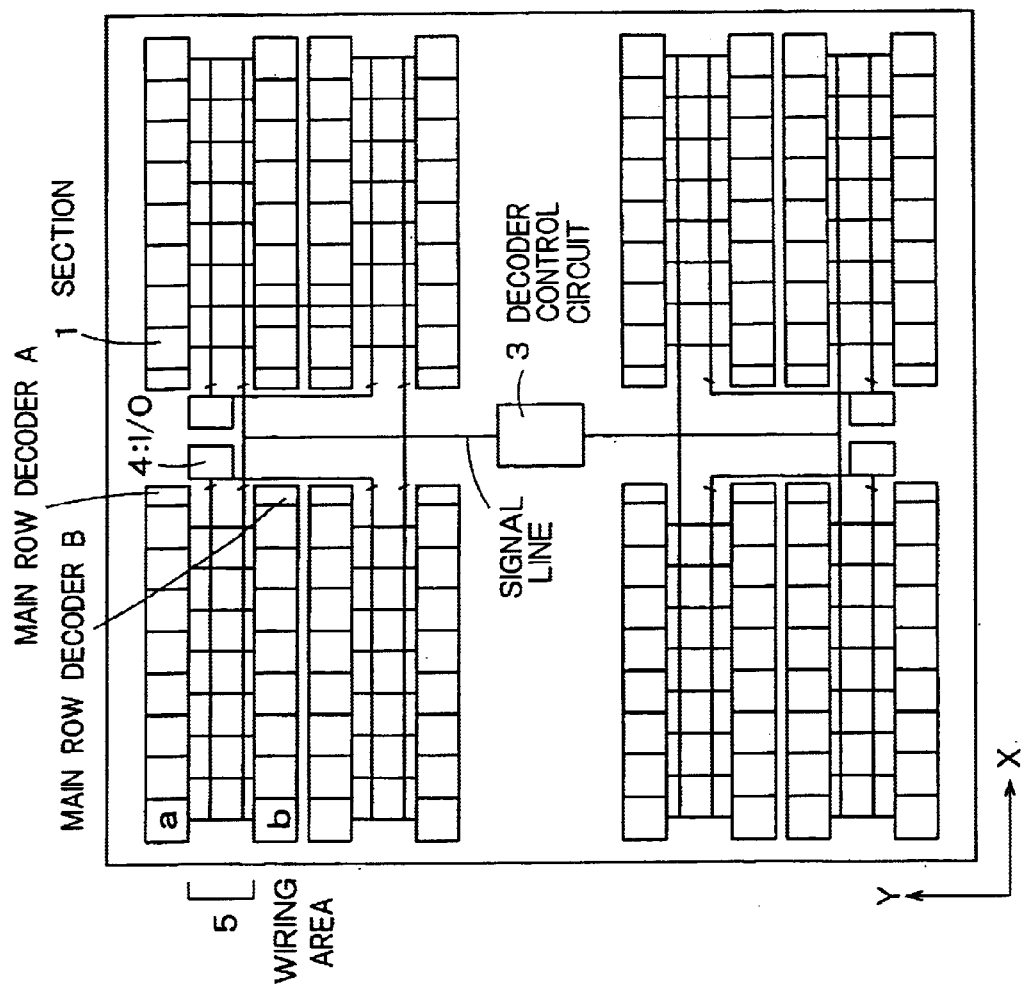
FIG. 4 is a plane layout view of a conventional semiconductor memory device.

FIG. 3 is a plane layout view of a semiconductor memory device according to a second embodiment of the present invention. The semiconductor memory device of FIG. 3 has a feature in which data lines transferred between the I/O circuits 4 and each of the sections 1 are arranged by dividing them into X and Y directions.

The I/O circuits 4 of FIG. 3 are arranged in the vicinity of the central portion of the chip. The data wirings connecting each of the I/O circuits 4 and each of the sections 1 are formed of the wirings W4 extending from the I/O circuit 4 in X direction, and the wirings W5 connected to the wiring W4 and extending in Y direction passing through the sections.

The wirings connecting the decoder control circuit 3 and each of the sections 1 are the same as those of FIG. 1.

In the second embodiment, the data wirings arranged between the sections 1 of Y direction in FIG. 1 are arranged on the respective sections. Because of this, it is possible to decrease the number of wirings between the sections 1 of Y direction, compared with that of FIG. 1, thereby further reducing the chip area.

In the above-mentioned embodiment, although an example in which the decoder control circuit 3 is arranged in the vicinity of the center of the chip has been described, a location for arranging the decoder control circuit 3 is not limited. Similarly, a location for arranging the I/O circuit 4 is not also limited. Furthermore, internal configuration of the section 1 is not limited to that of FIG. 2.

The semiconductor memory device according to the present invention is applicable to various memories including the SRAM.

What is claimed is:

1. A semiconductor memory device, comprising:
    a plurality of blocks arranged in line in a first direction, each block including a plurality of sections each having a cell group obtained by dividing a cell array composed of a plurality of cells and a cell group control circuit which controls read/write for the corresponding cell group and operates independently to each other, said plurality of sections being arranged in line in a second direction;
    data lines extending in said second direction and commonly connected to said plurality of sections in the same block, said data lines transferring data for said plurality of sections; and
    signal lines passing through said plurality of blocks and extending in said first direction, said signal lines transferring at least one of a control signal which controls read/write for said sections, an address signal which selects said sections, and the other signal transferred to said sections.

2. The semiconductor memory device according to claim 1, wherein said signal lines are commonly connected to the corresponding section of said plurality of blocks arranged in said first direction, respectively.

3. The semiconductor memory device according to claim 1, further comprising a plurality of block selection circuits which selects whether or not to select the corresponding block, each of said plurality of block selection circuits being provided to each block.

4. The semiconductor memory device according to claim 3, further comprising:
    a first section selection wiring which transfers a section selection signal-between-blocks for selecting said section arranged in said first direction; and
    a second section selection wiring which transfers a section selection signal-in-block for selecting said section arranged in said second direction;

wherein said cell group control circuit that each of said plurality of sections in blocks selected by said block selection circuit has, controls reading/writing operation for the corresponding section based on said section selection signal-between-blocks and said section selection signal-in-block.

5. The semiconductor memory device according to claim 4, further comprising a decode control circuit to which said first and second section selection wirings are connected, said decode control circuit being arranged to substantially central portion of the semiconductor memory device.

6. The semiconductor memory device according to claim 3, wherein each of said plurality of block selection circuits is arranged to an end portion of said second direction of the corresponding block.

7. The semiconductor memory device according to claim 1, wherein said data lines are extended between said blocks arranged adjacently in said first direction, said data lines transferring data in regard to all the sections in said blocks.

8. The semiconductor memory device according to claim 7, further comprising: data input/output circuits to which said data lines are connected, said data input/output circuits being commonly used for more than four pieces of said blocks, and arranged to an end portion in said second direction of said blocks, respectively.

9. The semiconductor memory device according to claim 1, wherein each of said plurality of sections includes:
a first direction cell line selection circuit which selects a cell line of said first direction in said sections;
a second direction cell line selection circuit which selects a cell line of said second direction in said sections;
a sense amplifier which senses data read out from said sections; and
a write circuit which outputs data to write into said sections.

10. The semiconductor memory device according to claim 9, wherein said cell group control circuit controls operation of said first direction cell line selection circuit, said second direction cell line selection circuit, said sense amplifier and said write circuit.

11. A semiconductor memory device, comprising:
a plurality of blocks arranged in line in a first direction, each block including a plurality of sections each having a cell group obtained by dividing a cell array composed of a plurality of cells and a cell group control circuit which controls read/write for the corresponding cell group and operates independently to each other, said plurality of sections being arranged in line in a second direction;
data lines extending on said plurality of blocks arranged in line in said first direction, said data lines transferring data to said sections in said plurality of blocks; and
signal lines passing through said plurality of blocks and extending in said first direction, said signal lines transferring at least one of a control signal which controls read/write for said sections, an address signal which selects said sections, and the other signal transferred to said sections.

12. The semiconductor memory device according to claim 11, wherein said signal lines are commonly connected to the corresponding section of said plurality of blocks arranged in said first direction, respectively.

13. The semiconductor memory device according to claim 11, further comprising a plurality of block selection circuits which selects whether or not to select the corresponding block, each of said plurality of block selection circuits being provided to each block.

14. The semiconductor memory device according to claim 13, further comprising:
a first section selection wiring which transfers a section selection signal-between-blocks for selecting said section arranged in said first direction; and
a second section selection wiring which transfers a section selection signal-in-block for selecting said section arranged in said second direction;
wherein said cell group control circuit that each of said plurality of sections in blocks selected by said block selection circuit has, controls reading/writing operation for the corresponding section based on said section selection signal-between-blocks and said section selection signal-in-block.

15. The semiconductor memory device according to claim 14, further comprising a decode control circuit to which said first and second section selection wirings are connected, said decode control circuit being arranged to substantially central portion of the semiconductor memory device.

16. The semiconductor memory device according to claim 13, wherein each of said plurality of block selection circuits is arranged to an end portion of said second direction of the corresponding block.

17. The semiconductor memory device according to claim 11, further comprising: data input/output circuits to which said data lines are connected, said data input/output circuits being commonly used for more than four pieces of said blocks, and arranged to an end portion in said second direction of said blocks, respectively.

18. The semiconductor memory device according to claim 11, wherein each of said plurality of sections includes:
a first direction cell line selection circuit which selects a cell line of said first direction in said sections;
a second direction cell line selection circuit which selects a cell line of said second direction in said sections;
a sense amplifier which senses data read out from said sections; and
a write circuit which outputs data to write into said sections.

19. The semiconductor memory device according to claim 18, wherein said cell group control circuit controls operation of said first direction cell line selection circuit, said second direction cell line selection circuit, said sense amplifier and said write circuit.

* * * * *